(12) United States Patent
Touya

(10) Patent No.: US 8,067,753 B2
(45) Date of Patent: Nov. 29, 2011

(54) ELECTRON BEAM WRITING APPARATUS AND METHOD

(75) Inventor: Takanao Touya, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 278 days.

(21) Appl. No.: 12/409,645

(22) Filed: Mar. 24, 2009

(65) Prior Publication Data

US 2009/0246655 A1 Oct. 1, 2009

(30) Foreign Application Priority Data

Mar. 25, 2008 (JP) .................................. 2008-076945
Jan. 30, 2009 (JP) .................................. 2009-020272

(51) Int. Cl.
*G21G 5/00* (2006.01)
(52) U.S. Cl. ............... 250/492.3; 250/492.1; 250/492.2; 250/491.1
(58) Field of Classification Search ............... 250/492.1, 250/492.2, 492.3, 491.1
See application file for complete search history.

(56) References Cited

U.S. PATENT DOCUMENTS

| 4,825,086 | A | * | 4/1989 | Mueller | .................. | 250/491.1 |
| 5,654,553 | A | | 8/1997 | Kawakubo et al. | | |
| 6,327,025 | B1 | * | 12/2001 | Imai | .............................. | 355/53 |
| 6,559,456 | B1 | | 5/2003 | Muraki | | |
| 6,741,331 | B2 | * | 5/2004 | Boonman et al. | ............... | 355/67 |
| 2002/0179857 | A1 | * | 12/2002 | Higuchi | ................... | 250/492.23 |
| 2006/0076514 | A1 | * | 4/2006 | Akeno | .................... | 250/492.22 |
| 2007/0103659 | A1 | * | 5/2007 | Yoshitake et al. | ............. | 355/53 |

FOREIGN PATENT DOCUMENTS

| JP | 10-55950 | 2/1998 |
| JP | 2000-49070 | 2/2000 |
| JP | 2000-133566 | 5/2000 |
| JP | 2007-335055 | 12/2007 |
| KR | 10-0414575 | 3/2004 |

OTHER PUBLICATIONS

Office Action issued Jan. 10, 2011, in Chinese Patent Application No. 200910209041.0 (with English translation).
Office Action issued Jan. 25, 2011, in Korean Patent Application No. 10-2009-24696 (with English translation).

* cited by examiner

*Primary Examiner* — Michael Maskell
(74) *Attorney, Agent, or Firm* — Oblon, Spivak, McClelland, Maier & Neustadt, L.L.P.

(57) ABSTRACT

A Z stage is placed on an XY stage in avoidance of an area to which a mark table is fixed. The mask M is placed on a holding mechanism provided on the Z stage. A middle value of the range adjustable by the focal adjustment mechanism is made coincident with the height of the mark table. The height of the mark table is measured and the heights of plural measurement points of the mask M are measured. The Z stage is moved in such a manner that the height of a middle value between highest and lowest values of the heights of these measurement points coincides with the height of the mark table.

15 Claims, 7 Drawing Sheets

Fig.9A  *Prior Art*
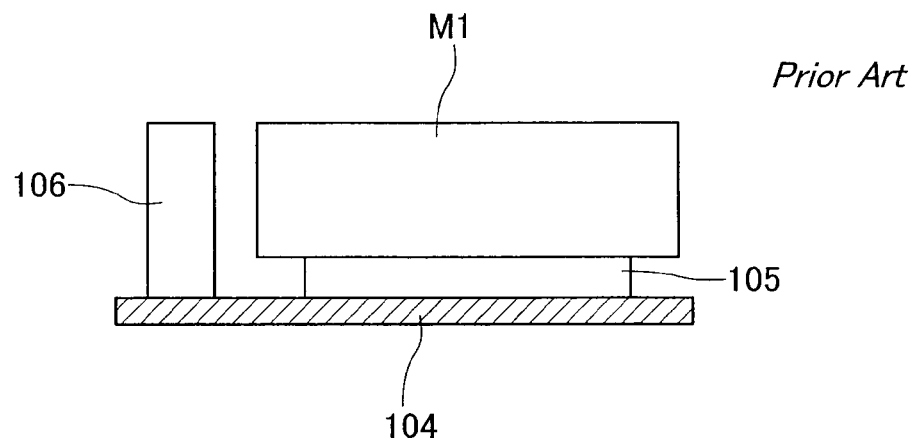
Fig.9B  *Prior Art*
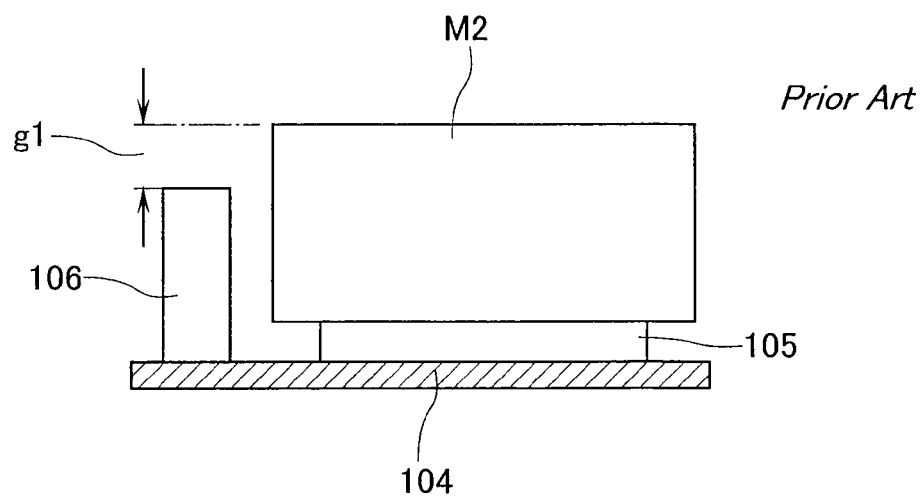
Fig.9C  *Prior Art*
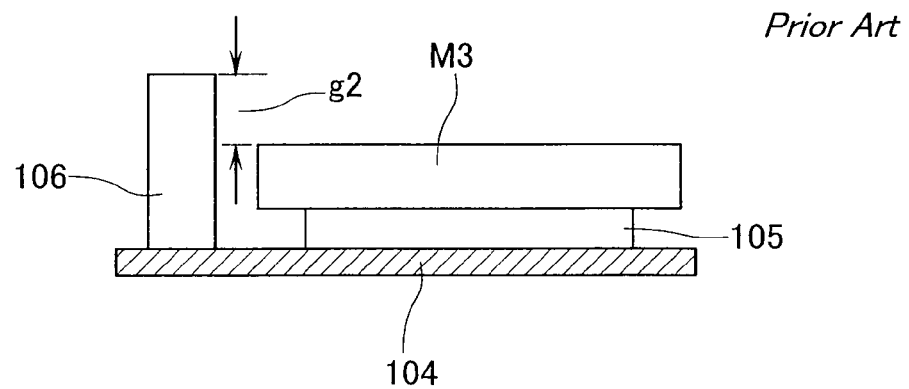

ELECTRON BEAM WRITING APPARATUS AND METHOD

BACKGROUND OF THE INVENTION

1. Field of the Invention

The present invention relates to an electron beam writing apparatus that has a holding mechanism for holding a mask at its back surface and irradiates the surface of the mask held by the holding mechanism with an electron beam thereby to write a desired pattern, and an electron beam writing method therefor.

2. Background Art

An upper surface holding mechanism for holding a mask upper surface has heretofore been adopted upon writing of each pattern on a mask by an electron beam writing apparatus. FIG. 7A shows a state in which a mask M is held by the upper surface holding mechanism. The upper surface holding mechanism is provided on an XY stage 104 movable in the direction orthogonal to the direction of an optical axis of an electron beam (not shown) emitted from an electronic optical lens barrel 101 equipped with an electronic optical system and comprises a clamp 102 having a top reference piece, for clamping the upper surface of the mask M and clamp pins 103 which are brought into contact with the back surface of the mask M coaxially with the top reference piece and urged upwardly by urging means provided outside the drawing, and has a structure in which the mask M is interposed between and held by the top reference piece of the clamp 102 and the clamp pins 103 (refer to, for example, a patent document 1).

Since the upper surface holding mechanism minimizes the contact with the mask M, cleanliness of the mask M can be maintained. Further, the upper surface holding mechanism suppresses an influence of an error in the surface of the mask M, which occurs due to the correction of the shape of the back surface of the mask M and is excellent in reproducibility.

Meanwhile, in order to meet a demand for miniaturization of circuit patterns of a recent semiconductor and the like, there is a need to enhance the resolution of an electron beam. To this end, an approximation of the electronic optical lens barrel 101 to the mask M is becoming very important. While the distance between the electronic optical lens barrel 101 and the mask M is now on the order of a few mm or so, the thickness of the top reference piece of the clamp 102 is also on the same order as that. Therefore, when the electronic optical lens barrel 101 is brought close to the mask M to meet the above demand as shown in FIG. 7B, it is becoming difficult to ensure space for the top reference piece of the clamp 102.

In order to solve such a problem, a back surface holding mechanism 105 for holding a mask M at its back surface, such as an electrostatic chuck may be used as a mask holding mechanism as shown in FIG. 8A. When, however, the back surface holding mechanism 105 is used, the thickness of the mask M has a tolerance of the order of 100 μm. Therefore, unlike the case where the upper surface holding mechanism described in FIG. 7A and 7B are used, a vertical position displacement of the surface of the mask M becomes manifest (refer to FIG. 8B).

When the vertical position displacement occurs, focus senility, a position displacement and the like occur upon actual writing even though a focal adjustment to the electron beam and a beam position adjustment are conducted by a mark table, thus causing a disadvantage that such influence is exerted on writing accuracy. If the heights of a mark table 106 and a mask M1 coincide with each other as shown in FIG. 9A by way of example, then writing can be conducted by an electron beam adjusted in advance by the mark table 106.

However, when a vertical displacement g1 is taking place because a mask M2 is higher than a mark table 106 as shown in FIG. 9B and when a vertical displacement g2 is taking place because a mask M3 is lower than a mark table 106 as shown in FIG. 9C, there is a need to correct the influences of the vertical displacements.

Here, an electronic optical lens barrel is equipped with a focal adjustment mechanism for varying a focal height of an electron beam in a predetermined adjustable range. It is considered that the correction of the influence of a vertical displacement is performed by the adjustment of the focal height by the focal adjustment mechanism (refer to, for example, a patent document 2). While there is a need to set an adjustable range for the focal height to the order of 100 μm corresponding to a mask's thickness tolerance in this case, it is difficult to ensure such a large adjustable range.

[Patent Document 1] Japanese Patent Application Laid-Open No. Hei 10(1998)-55950

[Patent Document 2] U.S. Pat. No. 6,741,331

SUMMARY OF THE INVENTION

With the foregoing in view, the present invention aims to provide an electron beam writing apparatus and method capable of correcting an influence of a vertical displacement of a mask without increasing an adjustable range of a focal height by a focal adjustment mechanism when the mask is held at its back surface.

According to one aspect of the present invention, an electron beam writing apparatus which has a holding mechanism for holding a mask at a back surface thereof and applies an electron beam onto a surface of the mask held by the holding mechanism by electron beam applying means thereby to write a desired pattern, comprises an XY stage movable in a direction orthogonal to the direction of an optical axis of the electron beam, an electron-beam focal adjusting mark table fixed onto the XY stage, a Z stage mounted onto the XY stage in avoidance of an area to which the mark table is fixed, and movable in the optical axis direction, and measuring means for measuring a height of the mark table and a height of the mask placed on the holding mechanism. The electron beam applying means includes a focal adjustment mechanism for varying a focal height of the electron beam within a predetermined adjustable range and a middle value of the adjustable range coincides with the height of the mark table. The mask holding mechanism includes difference calculating means placed on the Z stage and for calculating a difference between the height of the mark table measured by the height measuring means and the height of the mask placed on the holding mechanism, and Z stage control means for moving the Z stage based on information about the calculated difference in such a manner that the height of the mask coincides with the height of the mark table. The height of the mask used in the calculation of the difference calculating means is a middle value between highest and lowest values of heights of a plurality of measurement points, which are obtained by measuring the plurality of measurement points on the mask by the height measuring means.

According to another aspect of the present invention, in an electron beam writing method for applying an electron beam to a surface of a mask held by a holding mechanism for holding the mask at a back surface thereof by electron beam applying means to write a desired pattern, an electron beam focal adjusting mark table to is fixed an XY stage movable in a direction orthogonal to the direction of an optical axis of the electron beam. A Z stage movable in the optical axis direction is mounted on the XY stage in avoidance of an area to which the mark table is fixed. The holding mechanism is placed on the Z stage. The electron beam applying means is adjusted in such a manner that a middle value of a predetermined adjustable range of a focal height of the electron beam, the range being varied by a focal adjustment mechanism provided in the electron beam applying means, coincides with a height of the mark table. The height of the mark table is measured. Heights of a plurality of measurement points on the mask placed on the holding mechanism are measured. A middle value between highest and lowest values of the heights of the measurement points is set as a measured height of the mask. The measured height of mark table and the measured height of mask are compared to calculate a difference therebetween. The Z stage is movably controlled based on information about the calculated difference in such a manner that the height of the mask coincides with the height of the mark table.

BRIEF DESCRIPTION OF THE DRAWINGS

FIG. 9A is a side view illustrating a state in which a mark table and a mask coincide with each other in height, FIG. 9B is a side view showing a state in which the mask is higher than the mark table, and FIG. 9C is a side view depicting a state in which the mask is lower than the mark table.

DETAILED DESCRIPTION OF THE PREFERRED EMBODIMENTS

Figure 1:
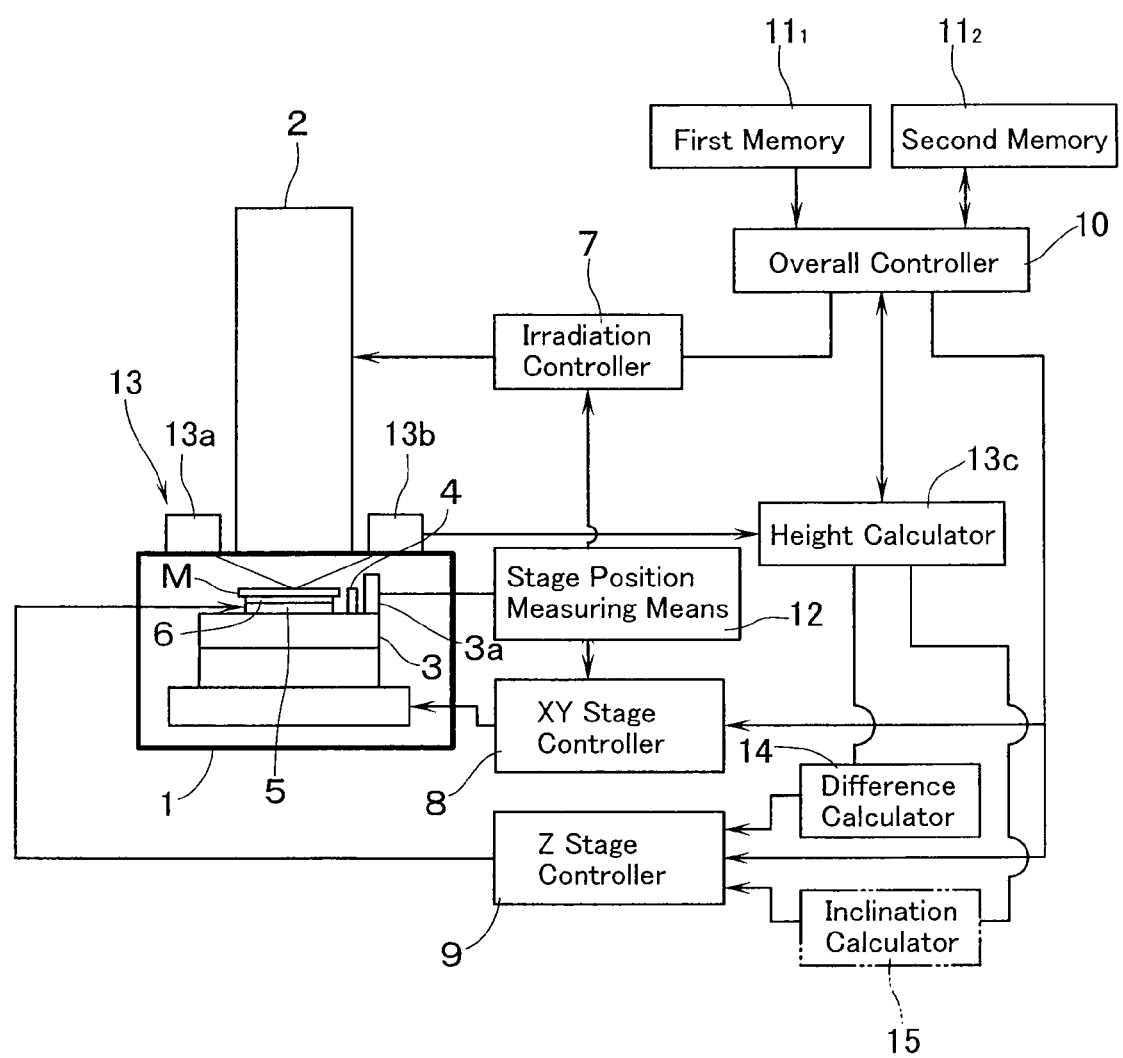
FIG. 1 is a conceptual view showing a configuration of an electron beam writing apparatus according to a first embodiment of the present invention.

FIG. 1 shows an electron beam writing apparatus which applies an electron beam onto the surface of a mask M to write a desired pattern. The electron beam writing apparatus includes a wring chamber 1, an electronic optical lens barrel 2 corresponding to electron beam applying means provided upright at a top or ceiling portion of the writing chamber 1. The writing chamber 1 is provided with an XY stage 3 movable in X and Y directions orthogonal to the direction of an optical axis of the electron beam.

Figure 2:
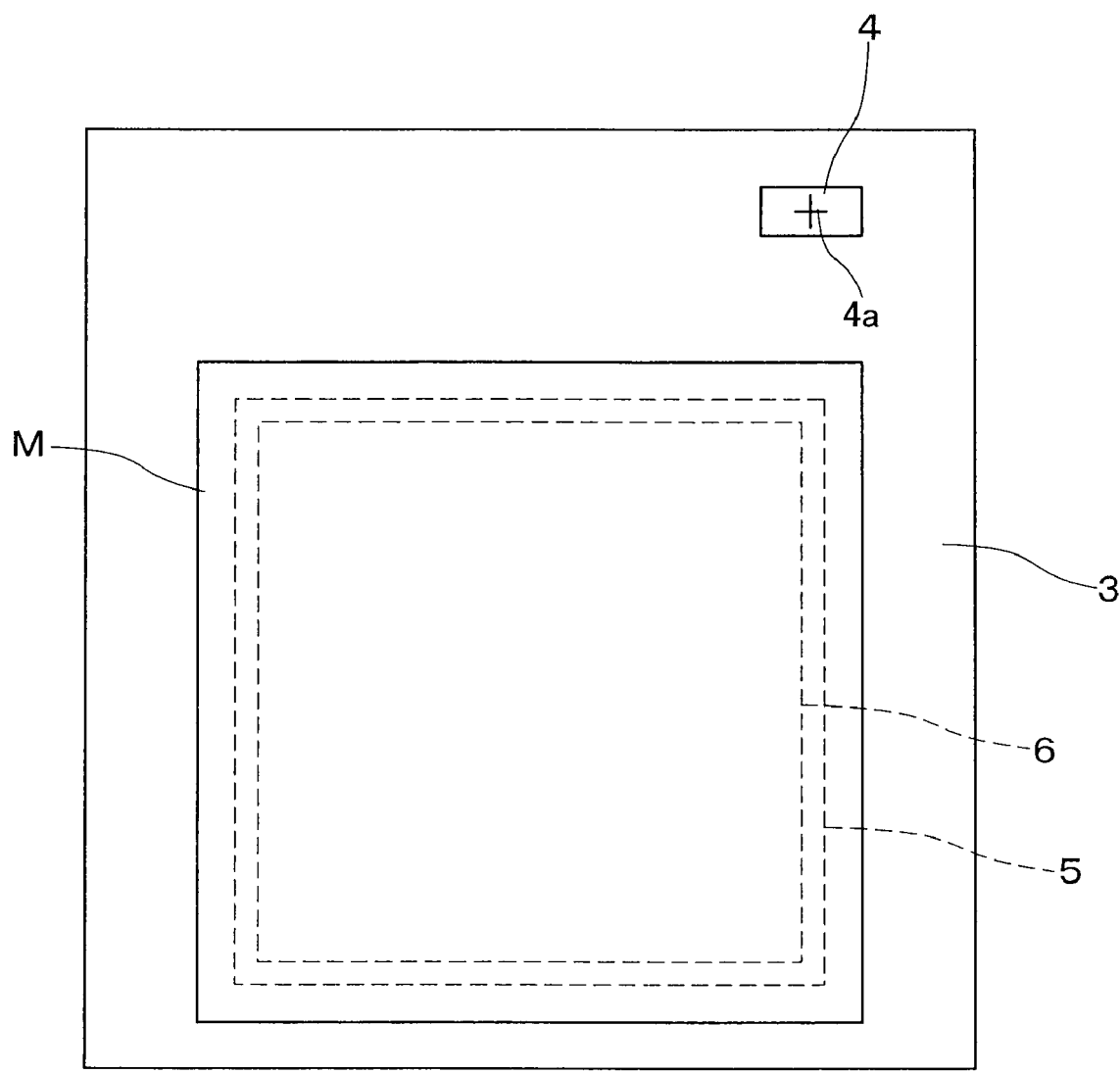
FIG. 2 is a plan view of part of an XY stage of the electron beam writing apparatus shown in FIG. 1.

As shown clearly in FIGS. 2 and 3, a mark table 4 is provided upright on the XY stage 3. The mark table 4 is used to adjust the focal point of the electron beam and the position thereof before writing. A Z stage 5 movable in the optical-axis direction of the electron beam, i.e., a Z direction is mounted on the XY stage 3 and to an area where the area at which the mark table 4 is provided upright is avoided. A holding mechanism 6 for holding the mask M at its back surface is provided on the Z stage 5.

Incidentally, when the moving velocity of the XY stage 3 is fast, an inertia force that acts on the mask M increases upon acceleration/deceleration thereof, thereby making it easy for the mask M to cause its position displacement. If the holding mechanism 6 is configured by an electrostatic chuck for adsorbing the back surface of the mask M here, then the position displacement of the mask M can be prevented.

The electronic optical lens barrel 2 is of a known one for forming an electron beam emitted from a built-in electron gun in a required sectional shape and thereafter deflecting the electron beam to apply it onto the mask M. It detailed description will be omitted. The electronic optical lens barrel 2 is controlled by an irradiation controller 7. Incidentally, the electronic optical lens barrel 2 is equipped with an objective lens 2a shown in FIG. 3A and changes the voltage applied to the objective lens 2a under the irradiation controller 7 thereby to allow a focal height of the electron beam to vary within a predetermined adjustable range. That is, the objective lens 2a and the irradiation controller 7 constitute a focal adjustment mechanism that causes the focal height of the electron beam to vary within the predetermined adjustable range.

A focal position of the objective lens 2a can be adjusted by other constituent elements of an electronic optical system, e.g., another objective lens or the like provided on the upper side of the objective lens 2a. Other constituent elements of the electronic optical system, e.g., another objective lens or the like is adjusted in such a manner that a middle value Fm (=(Fh+F1)/2) between a high limit Fh of the adjustable range of the focal height of the electron beam and a low limit F1 thereof coincides with the height of the mark table 4. Incidentally, the installed height of the objective lens 2a can also be adjusted by an adjusting screw or the like.

Upon this adjustment, the electron beam is scanned so as to cross a mark 4a engraved onto the upper surface of the mark table 4 in a state in which the focal height of the electron beam is maintained at the middle value Fm. Electrons reflected from the mark table 4 are detected by a reflected electron detector provided outside the drawing. When the focal height of the electron beam coincides with the height of the upper surface of the mark table 4, the detected number of reflected electrons rises steeply upon application of the electron beam onto the mark 4a. When, however, the focal height of the electron beam is shifted from the height of the upper surface of the mark table 4, a rise in the detected number of reflected electrons becomes slow. Then, the installed height of the objective lens 2a is adjusted in such a manner that the rise in the detected number of reflected electrons becomes steep, thereby causing the middle value Fm to coincide with the height of the upper surface of the mark table 4.

The XY stage 3 is controlled movably in the X and Y directions by an XY stage controller 8. The Z stage 5 is controlled movably in the Z direction by a Z stage controller 9. The irradiation controller 7, the XY stage controller 8 and the Z stage controller 9 are centralizedly controlled by an overall controller 10. A first memory $11_1$ and a second memory $11_2$ are connected to the overall controller 10. Pattern data are stored in the first memory $11_1$. The overall controller 10 creates writing data for defining the shape and position of each graphic form to be written based on the pattern data and causes the second memory $11_2$ to store the same therein.

The electron beam writing apparatus is equipped with stage position measuring means 12 for measuring the position in the X and Y directions of the XY stage 5 and height measuring means 13 for measuring the height of the mask M held by the holding mechanism 6. The stage position measuring means 12 comprises a laser length measuring unit or instrument for measuring the position of the XY stage 3 by incidence/reflection of laser light on and from a stage mirror 3a fixed to the XY stage 3. Incidentally, the stage mirror 3a is omitted in FIGS. 2 and 3.

The height measuring means 13 comprises a light projector 13a for causing the laser light to converge on the surface of the mask M from an oblique direction and applying the same thereto, a light detector 13b for receiving the light reflected from the mask M and detecting the position of the reflected light, and a height calculator 13c for calculating the height of the mask M from the position of the reflected light. Height data of the mask M measured by the height measuring means 13 is inputted to the overall controller 10.

Upon writing of each pattern onto the mask M, the overall controller 10 outputs an operation command to the XY stage controller 8 to move the XY stage 3. The irradiation controller 7 performs molding control and deflection control on the electron beam lying in the electronic optical lens barrel 2, based on the writing data inputted thereto from the overall controller 10 while confirming the position of the XY stage 3 measured by the stage position measuring means 12, thereby to apply the electron beam to a required position of the mask M. Further, the height measuring means 13 measures the height of an electron beam irradiation spot of the mask M in real time and adjusts the focal height of the electron beam in matching with the height of the mask M thereby to correct an influence produced due to a vertical displacement.

On the other hand, when the back surface of the mask M is held by the holding mechanism 6, a vertical displacement corresponding to a thickness tolerance of the mask M occurs. In order to correct the influence produced due to the vertical displacement by the focal height adjustment, there is a need to set a focal height adjustable range to the order of 100 μm corresponding to the thickness tolerance of the mask M. It is however difficult to ensure such a large adjustable range.

Figure 3A:
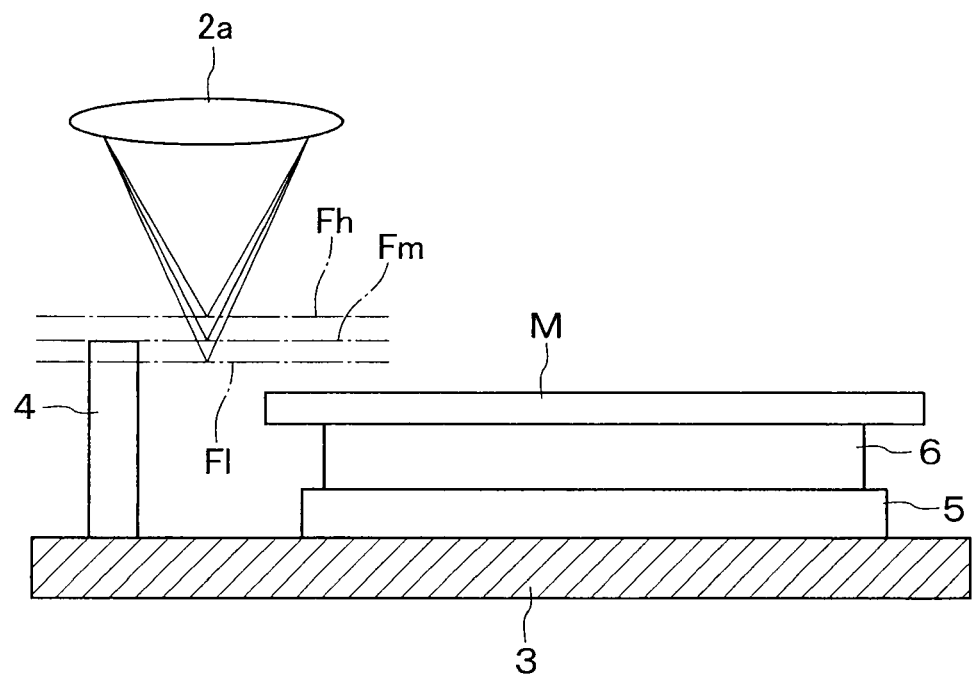
FIG. 3A is a side view illustrating a state prior to a height adjustment by a Z stage employed in the first embodiment.
Figure 3B:
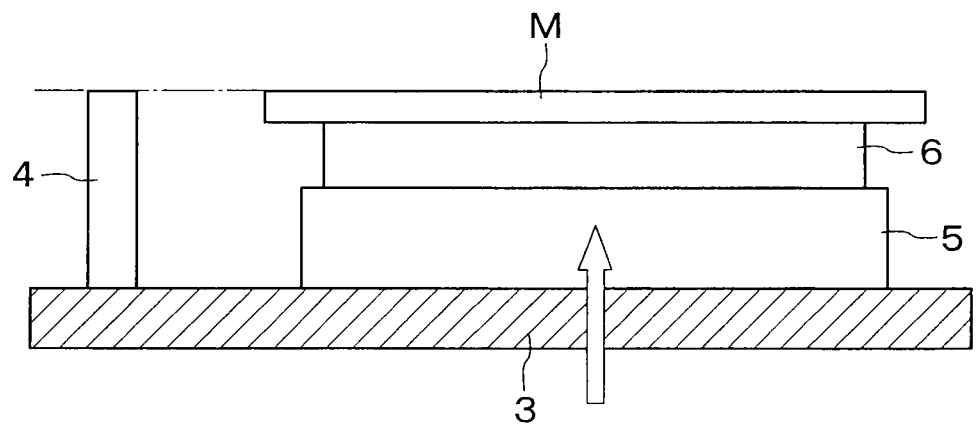
FIG. 3B is a side view showing a state subsequent to a height adjustment by the Z stage employed in the first embodiment.

Thus, in the present embodiment, the movement control of the Z stage 5 is performed to allow the height of the mask M to coincide with the height of the mark table 4 subjected to the adjustment of the electron beam. FIGS. 3A and 3B show states prior and subsequent to a height adjustment by the Z stage 5. FIG. 3A shows a pre-adjustment state where the height of the mask M is lower than the height of the mark table 4. FIG. 3B illustrates a post-adjustment state where the Z stage 5 is moved in an upward direction to cause the height of the mask M to coincide with the height of the mark table 4. Incidentally, when the mask M is higher than the mark table 4, although not shown in the drawing, the Z stage 5 may be moved in a downward direction to adjust the height.

A drive mechanism of the Z stage 5 is, for example, configured in such a manner that a pair of tables are provided with guide means such as bearings interposed therebetween such that opposite taper-shaped inclined surfaces become parallel, and the lower table is moved in the horizontal direction by a stepping motor or an ultrasonic motor thereby to move the upper table in the upward and downward directions.

Figure 4:
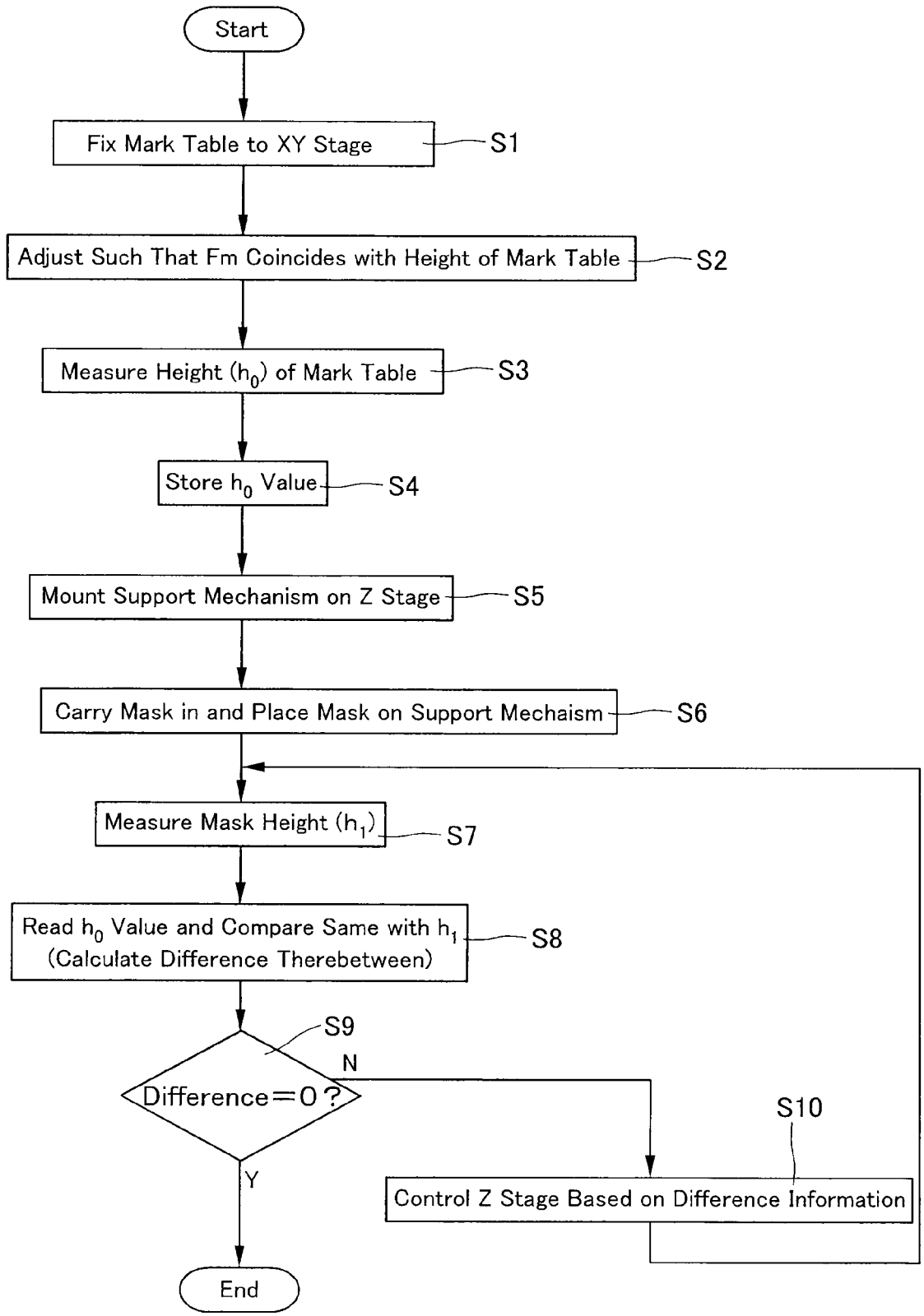
FIG. 4 is a flowchart depicting a processing procedure of the height adjustment by the Z stage.

FIG. 4 shows a processing procedure of a height adjustment by the Z stage 5. The mark table 4 is first fixed to the XY stage 3 (S1). Next, the installed height of the objective lens 2a is adjusted as described above to cause the middle value Fm between the high limit Fh of the adjustable range of the focal height of the electron beam and the low limit F1 thereof to coincide with the height of the mark table 4 (S2). The height ($h_0$) of the mark table 4 is measured by the height measuring means 13 (S3). The measured height ($h_0$) of mark table 4 is stored in a memory or the like (S4).

Then, the holding mechanism 6 is mounted onto the Z stage 5 (S5). The mask M is carried into the writing chamber 1 and placed on the holding mechanism 6 (S6).

Next, the height ($h_1$) of the placed mask M is measured by the height measuring means 13 (S7). Incidentally, since the mask M has a vertical height difference depending on locations, there is a possibility that variations in height will occur depending on measurement points. Thus, upon measurement of the height of the mask M, a plurality of measurement points lying on the mask M are measured by the height measuring means 13, and an intermediate value (=(highest value+lowest value)/2) between the highest and lowest values of the heights of the plural measured points is assumed to be the height ($h_1$) of the mask M. Incidentally, when the mask M is held by the holding mechanism 6, the shape of the surface of the mask M changes due to the parallelism and gravity sag. Therefore, the plurality of measurement points on the mask M measured by the height measuring means 13 are preferably at least five spots corresponding to the four corners of the mask M and its center.

After the measurement of the height ($h_1$) of the mask M, the stored height ($h_0$) of mark table is read. A difference calculator 14 (refer to FIG. 1) compares the height ($h_1$) of the mask M and the height ($h_0$) of the mark table 4 and calculates a difference between the two (S8). Since both heights coincide with each other where the difference is "0" (S9), the height adjustment is finished and writing is started. On the other hand, when the difference is not "0", i.e., the two do not coincide with each other in height, the Z stage controller 9 movably controls the Z stage 5 based on information about the difference (S10). The processes from S7 to S9 are executed again. Incidentally, the difference is utilized as a constant threshold value or less without assuming "0".

If such height adjustments as described above are conducted, then writing to the mask M can be performed at the same height as that of the mark table 4 subjected to the electron beam adjustment. Further, the height of the mark table 4 is matched with the middle value Fm of the adjustable range of the focal adjustment mechanism, and the height of the mask M matched with the height of the mark table 4 is set to the middle value between the highest and lowest values of the heights of the plural measurement points, whereby the heights of the highest and lowest points of the surface of the mask M fall within the adjustable range of the focal adjustment mechanism. As a result, even though the adjustable range of the focal adjustment mechanism is not set large according to the thickness tolerance of the mask M, the influence of the vertical displacement of the mask M can be corrected by making the most of the adjustable range of the focal adjustment mechanism.

Incidentally, the height ($h_0$) of the mask table 4 may be measured after the placement of the mask M on the holding mechanism 6. Further, the adjustment for the coincidence of the middle value Fm of the adjustable range of the focal adjustment mechanism with the height of the mark table 4 may be performed after the placement of the holding mechanism 6 on the Z stage 5.

Figure 5A:
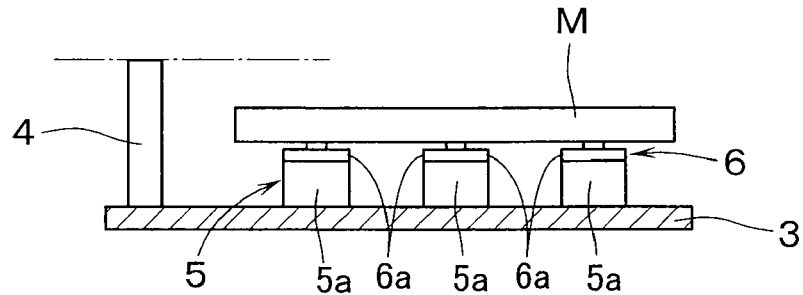
FIG. 5A is a side view showing a state prior to a height adjustment by a Z stage employed in a second embodiment of the present invention.
Figure 5B:
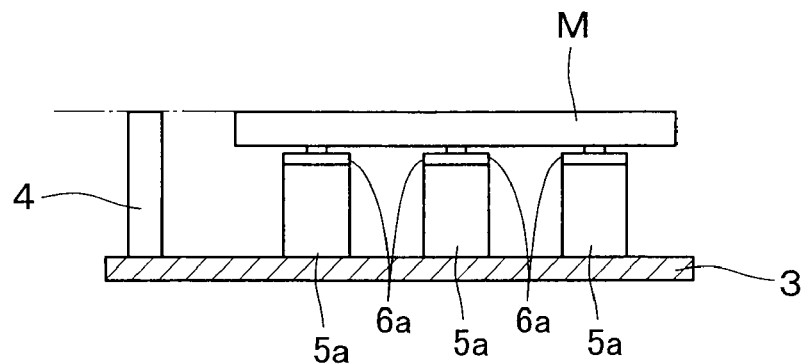
FIG. 5B is a side view illustrating a state subsequent to a state subsequent to a height adjustment by the Z stage employed in the second embodiment.

Although the Z stage 5 and the holding mechanism 6 are respectively comprised of the single member in the first embodiment, it is also possible to configure the Z stage 5 by a plurality of support pins 5a vertically moved in sync with each other by a single drive mechanism, and to configure the holding mechanism 6 by a plurality of reception seats 6a placed on the support pins 5a respectively as in the case of a second embodiment shown in FIG. 5A and 5B. A mask M is seated on and held by these reception seats 6a at its back surface. Incidentally, the second embodiment is applied to the case where the moving velocity of an XY stage 3 is slow. A position displacement of the mask M is prevented by a frictional force produced between each reception seat 6a and the mask M.

Even in the second embodiment, when the height of the mask M is different from that of a mark table 4 as shown in FIG. 5A, the above-described height adjustment processing is performed and the plurality of support pins 5a are driven to allow the height of the mask M to coincide with the height of the mark table 4 as shown in FIG. 5B.

On the other hand, there is also a case where it is necessary to adjust the height of the mask M by correcting not only its upward and downward movements by the Z stage 5 but also its inclination or tilt. Thus, in a third embodiment shown in FIG. 6A and 6B, the Z stage 5 is configured as one equipped with inclination correcting means. That is, the Z stage 5 is comprised of three support pins (support mechanisms) 5b movable independently with respect to the direction of an optical axis of an electron beam. Reception seats 6a that constitute a holding mechanism 6 are provided on the support pins 5b respectively. Incidentally, the number of the support pins 5b is not limited to three, but may be set to four or more.

Figure 6A:
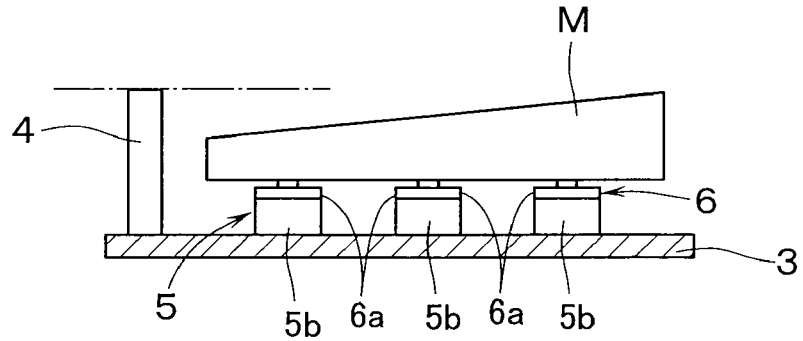
FIG. 6A is a side view showing a state prior to a height adjustment by a Z stage employed in a third embodiment of the present invention, an FIG. 6B is a side view illustrating a state subsequent to a height adjustment by the Z stage employed in the third embodiment.
Figure 6B:
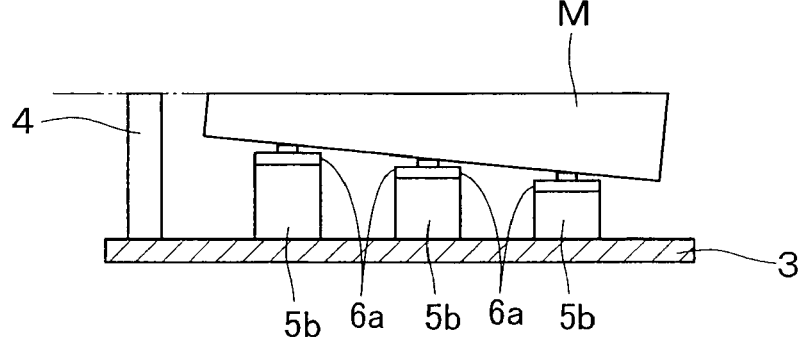
Figure 7A:
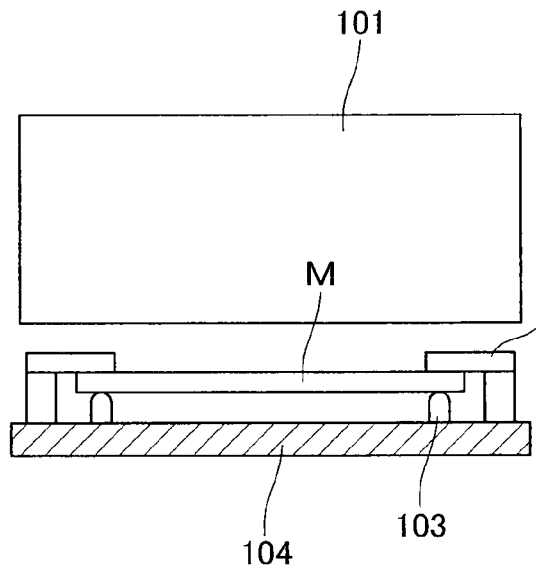
FIG. 7A is a side view showing a holding state of a mask by an upper surface holding mechanism.
Figure 7B:
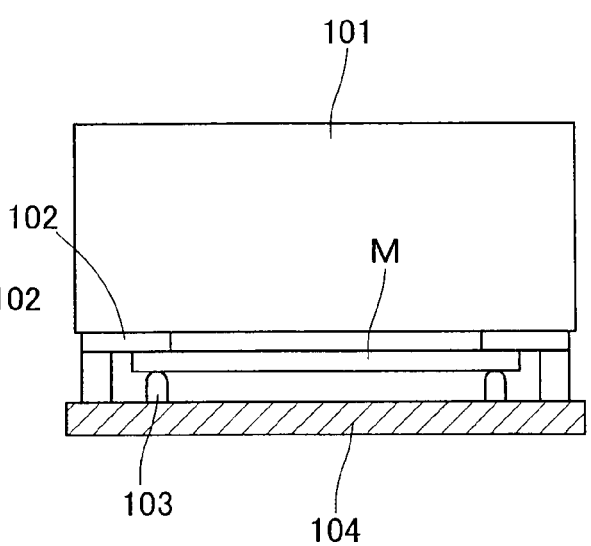
FIG. 7B is a side view illustrating a state in which the distance between an electronic optical lens barrel and the mask is reduced.
Figure 8A:
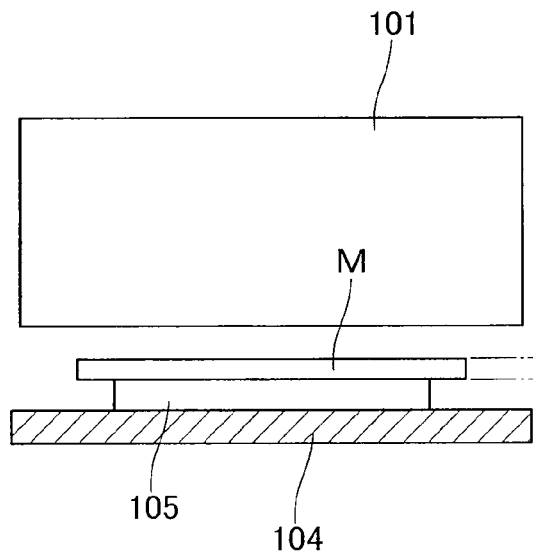
FIG. 8A is a side view showing a holding state of a mask by a back surface holding mechanism.
Figure 8B:
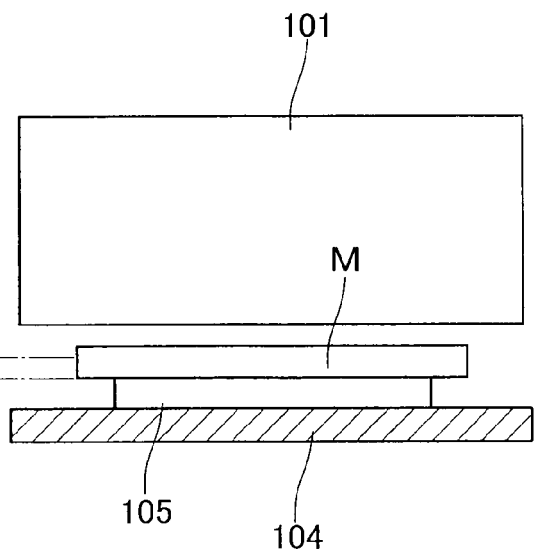
FIG. 8B is a side view depicting a vertical displacement corresponding to a thickness tolerance of the mask.

When the thickness of the mask M is ununiform, the surface of the mask M tilts as shown in FIG. 6A. In this case, the inclination of the mask M is calculated and the support pins 5b are individually driven according to the inclination to correct the inclination of the mask M such that the surface of the mask M becomes orthogonal to the optical axis of the electron beam. Thereafter, in a manner similar to the first embodiment, the heights of a plurality of measurement points on the mask M are measured, and the support pins 5b are sync-driven in such a manner that a middle value between the highest and lowest values of the heights of these measurement points coincides with the height of the mark table 4. Thus, as shown in FIG. 6B, the height of the mask M can be made coincident with the height of the mark table 4 in a state in which the surface of the mask M is set orthogonal to the optical axis of the electron beam.

Incidentally, the heights of the plurality of measurement points of the mask M are measured before the correction of the inclination of the mask M. The support pins 5b are sync-driven in such a manner that the middle value between the highest and lowest values of the heights of these measurement points coincides with the height of the mark table 4, thereby to adjust the height of the mask M. Thereafter, the support pins 5b may be individually driven according to the inclination of the mask M to correct the inclination of the mask M.

As to a method for calculating the inclination of the mask M, height measuring means 13 may measure the heights of plural measurement points on the mask M and determine, for example, an optimal linear approximate equation by a least squares method, based on data about the measured heights. That is, a and b determined by approximating x and y of a differential equation $Z'=f(x, y)$ of the above measured data $Z_i=F(x_i, y_i)$ by a linear approximate equation $ax+by+c$ become slopes. In order to correct the slopes, the slopes determined in like manner after the correction may be set to reach 0. Incidentally, c corresponds to a vertical correction portion of each support pin 5b.

The inclination of the mask M is calculated by an inclination calculator 15 indicated by a virtual line in FIG. 1. Then, information about the inclination calculated by the inclination calculator 15 is transmitted to the Z stage controller 9, where the support pins 5b are movably controlled individually in such a manner that the inclination of the mask M is corrected.

Incidentally, although the reception seats 6a are respectively provided on the support pins 5a and 5b in the second and third embodiments, the reception seats 6a may be formed integrally with the support pins 5a and 5b at upper ends thereof respectively. The holding mechanism 6 comprised of the electrostatic chuck employed in the first embodiment can also be provided on the support pins 5a and 5b of the second and third embodiments respectively.

The features and advantages of the present invention may be summarized as follows.

According to the electron beam writing apparatus and method of the present invention, there is no constraint to physical space of a holding mechanism required where held at an upper surface of a mask. Thus, an electronic optical lens barrel can be brought closer to the mask than conventional, thereby making it possible to meet a high demand for miniaturization. Separating a Z stage provided with a mask's holding mechanism and a mark table from each other makes it possible to perform writing to the mask at the same height as that of the mark table subjected to an electron beam adjustment. Further, a middle value of an adjustable range of a focal adjustment mechanism is matched with the height of the mark table, and the height of the mask made coincident with the height of the mark table is set to a middle value between highest and lowest values of heights of a plurality of measurement points, whereby the heights of the highest and lowest points of the surface of the mask fall within the adjustable range of the focal adjustment mechanism. As a result, even though the adjustable range of the focal adjustment mechanism is not set large according to the thickness tolerance of the mask M, the influence of a vertical displacement of the mask can be corrected by making the most of the adjustable range of the focal adjustment mechanism.

Obviously many modifications and variations of the present invention are possible in the light of the above teachings. It is therefore to be understood that within the scope of the appended claims the invention may be practiced otherwise than as specifically described.

The entire disclosure of a Japanese Patent Applications No. 2008-076945, filed on Mar. 25, 2008 and No. 2009-020272, filed on Jan. 30, 2009 including specifications, claims, drawings and summarys, on which the Convention priority of the present application is based, are incorporated herein by reference in its entirety.

What is claimed is:

1. An electron beam writing apparatus which has a holding mechanism for holding a mask at a back surface thereof and applies an electron beam onto a surface of the mask held by the holding mechanism by electron beam applying means thereby writing a desired pattern, comprising:

an XY stage movable in a direction orthogonal to the direction of an optical axis of the electron beam;

an electron-beam focal adjusting mark table fixed onto the XY stage;

a Z stage mounted onto the XY stage in avoidance of an area to which the mark table is fixed, and movable in the optical axis direction; and measuring means for measuring a height of the mark table and a height of the mask placed on the holding mechanism, wherein the electron beam applying means includes a focal adjustment mechanism for varying a focal height of the electron beam within a predetermined adjustable range and a middle value of the adjustable range coincides with the height of the mark table, wherein the mask holding mechanism includes difference calculating means placed on the Z stage for calculating a difference between the height of the mark table measured by the height measuring means and the height of the mask placed on the holding mechanism, and Z stage control means for moving the Z stage based on information about the calculated difference in such a manner that the height of the mask coincides with the height of the mark table, and wherein the height of the mask used in the calculation of the difference calculating means is a middle value between highest and lowest values of heights of a plurality of measurement points, which are obtained by measuring the plurality of measurement points on the mask by the height measuring means.

2. The electron beam writing apparatus according to claim 1, wherein the measurement points on the mask measured by the height measuring means are at least five spots corresponding to four corners of the mask and the center thereof.

3. The electron beam writing apparatus according to claim 1, further including inclination calculating means for calculating an inclination of the mask placed on the holding mechanism, wherein the Z stage includes inclination correcting means for correcting the inclination of the mask based on information about the calculated inclination in such a manner that the surface of the mask becomes orthogonal to the optical axis of the electron beam.

4. The electron beam writing apparatus according to claim 2, further including inclination calculating means for calculating an inclination of the mask placed on the holding mechanism, wherein the Z stage includes inclination correcting means for correcting the inclination of the mask based on information about the calculated inclination in such a manner that the surface of the mask becomes orthogonal to the optical axis of the electron beam.

5. The electron beam writing apparatus according to claim 3, wherein the Z stage equipped with the inclination correcting means comprises three or more support mechanisms movable independently with respect to the optical axis direction.

6. The electron beam writing apparatus according to claim 4, wherein the Z stage equipped with the inclination correcting means comprises three or more support mechanisms movable independently with respect to the optical axis direction.

7. The electron beam writing apparatus according to claim 1, wherein the holding mechanism comprises an electrostatic chuck for adsorbing the back surface of the mask.

8. An electron beam writing method for applying an electron beam to a surface of a mask held by a holding mechanism for holding the mask at a back surface thereof by electron beam applying means by writing a desired pattern, comprising the steps of:

fixing an electron beam focal adjusting mark table to an XY stage movable in a direction orthogonal to the direction of an optical axis of the electron beam, mounting a Z stage movable in the optical axis direction on the XY stage in avoidance of an area to which the mark table is fixed, and placing the holding mechanism on the Z stage;

adjusting the electron beam applying means in such a manner that a middle value of a predetermined adjustable range of a focal height of the electron beam, said range being varied by a focal adjustment mechanism provided in the electron beam applying means, coincides with a height of the mark table; and measuring the height of the mark table, measuring heights of a plurality of measurement points on the mask placed on the holding mechanism, setting a middle value between highest and lowest values of the heights of the measurement points as a measured height of the mask, comparing the measured height of mark table and the measured height of mask to calculate a difference therebetween, and movably controlling the Z stage based on information about the calculated difference in such a manner that the height of the mask coincides with the height of the mark table.

9. The electron beam writing method according to claim 8, wherein the plurality of measurement points are at least five spots corresponding to four corners of the mask and the center thereof.

10. The electron beam writing method according to claim 8, further including an inclination correcting step for calculating an inclination of the surface of the mask from the heights of the plurality of measurement points on the mask placed on the holding mechanism and controlling inclination correcting means provided in the Z stage, based on information about the calculated inclination in such a manner that the surface of the mask becomes orthogonal to the optical axis of the electron beam.

11. The electron beam writing method according to claim 9, further including a step for calculating an inclination of the surface of the mask from the heights of the plurality of measurement points on the mask placed on the holding mechanism, and controlling inclination correcting means provided in the Z stage, based on information about the calculated inclination in such a manner that the surface of the mask becomes orthogonal to the optical axis of the electron beam.

12. The electron beam writing method according to claim 10, wherein the inclination correcting step is performed after the height adjusting step.

13. The electron beam writing method according to claim 11, wherein the inclination correcting step is performed after the height adjusting step.

14. The electron beam writing method according to claim 10, wherein the height adjusting step is performed after the inclination correcting step.

15. The electron beam writing method according to claim 11, wherein the height adjusting step is performed after the inclination correcting step.

* * * * *